United States Patent [19]
Lane et al.

[11] Patent Number: 5,737,254
[45] Date of Patent: Apr. 7, 1998

[54] SYMMETRICAL FILTERING APPARATUS AND METHOD THEREFOR

[75] Inventors: John E. Lane, Satellite Beach, Fla.; Dan Hoory; Eduardo F. Martinez, both of Austin, Tex.

[73] Assignee: Motorola Inc., Schaumburg, Ill.

[21] Appl. No.: 549,503

[22] Filed: Oct. 27, 1995

[51] Int. Cl.⁶ .................................................. G06F 17/10
[52] U.S. Cl. .............................. 364/724.17; 364/724.01
[58] Field of Search .......................... 364/724.17, 724.01

[56] References Cited

U.S. PATENT DOCUMENTS

| | | | |
|---|---|---|---|
| 5,195,141 | 3/1993 | Jang | 381/103 |
| 5,255,215 | 10/1993 | Sakata et al. | 364/724.01 |
| 5,282,252 | 1/1994 | Orban | 381/98 |
| 5,388,062 | 2/1995 | Knutson | 364/724.17 |

OTHER PUBLICATIONS

"Design of a Digital Biquadratic Peaking or Notch Filter for Digital Audio Equalization" by Stanley A. White. Journal of Audio Engineering Society, vol. 34, No. 6, 1986. pp. 479–483.

J. Lane et al., Implementing IIR/FIR Filters with Motorola's DSP56000/DSP6001, APR7/D, Rev2 Sect. 2–"Second–Order Direct–Form IIR Digital Filter Sections," 1993, pp. 2.1–2.27.

Hillman et al., ICASSP 1989, "Real–Time Determination of IIR Coefficients for Cascaded Butterworth Filters", Dec. 20, 1988, pp. 1–4.

Lane et al., Computer Music Journal, vol. 14, No. 3, Fall 1990,"Pitch Detection Using a Tunable IIR Filter," pp. 46–59.

Pierce et al., The Science of Musical Sound,"Sine Waves and Resonance", 1989, Chapter 3, pp. 40–57.

Zudock et al., DSP & Multimedia Technology, "Software Design Tools for the Motorola DSP56000," Nov. 1994, pp. 54–65.

Primary Examiner—David H. Malzahn

[57] ABSTRACT

A data processing system (10) implements a symmetrical filtering function about the unity gain line using a single filter (33). The data processing system (10) includes a bus (12), an I/O port (12), memory (16), and a processor (18). The I/O port (12) receives filter control parameters (20) and receives and transmits digitized data. The processor receives the filter control parameters (20) and calculates filter coefficients (44, 48, 52). The processor (18) implements the single stage filter (33) based upon the filter coefficients (44, 48, 52) to filter the digitized input data (22) and produce filtered digitized data (24). The single stage filter (33) may include a band pass, high pass, or low pass function. The single stage filtering function (33) produces a filtering function that is symmetrical about the unity gain line. Variable Q operation of the data processing system (10) allows Q of the filtering function to vary with boost/cut level (34). A method (150), a graphic equalizer (200), and digital telephone (250) also incorporate the symmetrical filtering function.

33 Claims, 10 Drawing Sheets

SYMMETRICAL FILTERING APPARATUS AND METHOD THEREFOR

TECHNICAL FIELD OF THE INVENTION

This invention relates generally to the filtering of audio signals and more particularly to a single stage filter and associated method of operation that produces a symmetrical response about the unity gain line.

BACKGROUND OF THE INVENTION

The filtering of audio signals has been known in the art for years to compensate for limitations in speakers, amplifiers, microphones, room acoustics, and other factors that may corrupt an audio signal. For example, when an audio signal is reconstructed from a compact disc or tape, it is often desirable to process the output signals in such a way as to compensate for the frequency response of an imperfect playback mechanism. In the case of studio and recording applications, filters are used to balance the frequency response of each individual channel. In other situations, filters may be used to alter the characteristics of a signal by removing unwanted components, such as noise, static, and harmonic distortion.

As those skilled in the art will appreciate, implementing a particular filtering function may be difficult and complex depending upon a desired filtering function to be implemented, system limitations, and cost limitations. While a common goal in the filtering of signals is to have a filter response correspond with user provided filtering parameters, the various problems associated with implementing the filter precluded this goal. In many prior art filters, the associated filtering functions did not agree with user parameters and the filters operated inaccurately when compared with the user provided filtering parameters.

One particular application requiring accurate filter performance is that of graphic equalizers. Graphic equalizers are filtering devices that have a variable frequency response across a frequency spectrum based upon user input. A typical graphic equalizer divides the audible frequency spectrum, typically 20 Hz to 20,000 Hz, into a number of frequency bands and, based upon user input, performs a filtering function in each band. Each band filtering function theoretically operates only on its own band and has no effect on adjacent bands. For each band, the user desires the graphic equalizer to either boost or cut the signal within the band to compensate for limitations in system components or simply to alter the signal for differences in listening preference.

Figure 1:
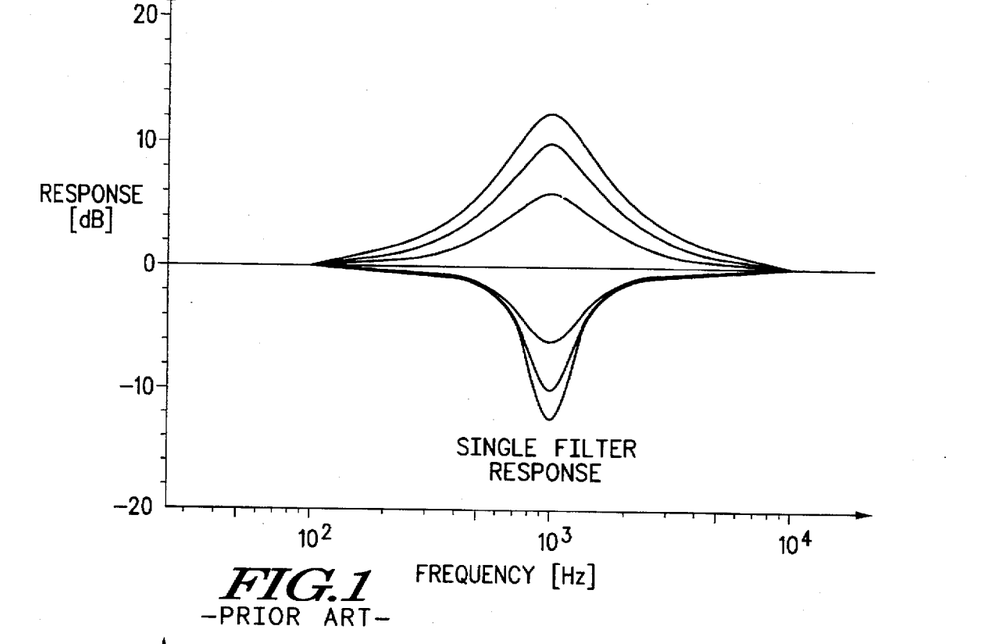
FIG. 1 is a graphical illustration of a prior art single stage band pass filter response illustrating an asymmetrical filtering response function about the unity gain line.

FIG. 1 illustrates, in graphical form, a filter response of a prior art single stage band pass filter. Frequency is on the horizontal axis while the boost/cut level (or gain) of the filter response in decibels is on the vertical axis. As is known in the art, the decibel response is 10 times the log base 10 of the ratio of power out of a device to power in to the device. At a frequency where the power out is equal to the power in, the response will be zero dB. Zero dB may also be considered as a point where the filter response has unity gain and that power out is equal to the power in. Thus, in the graph of FIG. 1, the unity gain line is equal to the 0 dB response line.

In many applications, such as a graphic equalizer, a symmetrical response about the unity gain line is desired. With a symmetrical response, the filter produces a consistent operation in both the boost and cut regions in particular frequency band of interest. However, developing a symmetrical filtering function is difficult. The filter response illustrated in FIG. 1 is of a single stage filter and is not-symmetrical about the unity gain line. When the filter provides boost above the unity gain line, the filtering function is wider than when the filter provides cut below the unity gain line. As is known in the art, a single stage filter exhibits a non-symmetrical filtering function because of its inherent qualities. More specifically, when a single filter is used in a boost/cut equalizer network, such that the center or nominal response is zero dB, it is an inherent property that the overall network response will not be symmetrical about the zero dB line. The reason for this is the manner in which the transfer function of a single stage filter combines with the equalizer network.

In order to implement a filter having a symmetrical response, two filters may be used for each frequency band. While the use of dual filters for particular frequency bands does produce a symmetrical filtering function, it effectively doubles the overhead costs associated with the filter. When implemented in hardware, the dual filter approach requires twice the hardware. When implemented in software in a digital signal processor, the dual filters double the processing requirements and time for performing the specific symmetrical filtering functions. A second approach for implementing a filter having a symmetrical response involves the use of a single stage digital filter and a coefficient data table coupled to the gain setting. A single stage digital filter coupled with a coefficient table requires extra hardware and overhead costs. Thus, many users of single filters have been forced to implement a design with the non-symmetrical filter response about the unity gain line to conserve overhead costs.

Figure 2:
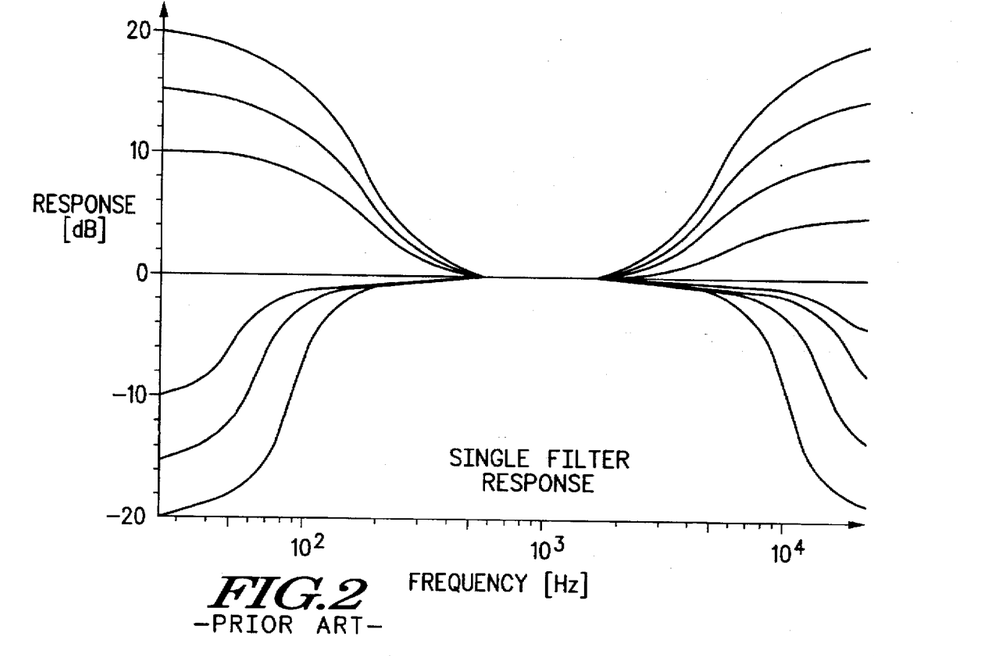
FIG. 2 is a graphical illustration of a prior art single stage low pass filter response and a prior art single stage high pass filter response, both illustrating an asymmetrical filtering response about the unity gain line.

FIG. 2 illustrates filter responses of a prior art single stage high pass filter and a prior art single stage low pass filter. As shown, the single stage filter responses of both the high pass and low pass filters are also non-symmetrical about the unity gain line. With both the high pass and low pass filters as well, the use of dual filters can produce a symmetrical response but also effectively doubles the cost of the filter for both hardware and software implementations. Likewise, a single stage digital filter with a coefficient table coupled to the gain setting may be used to produce a symmetrical response for lowpass and highpass filters. Again, however, there are higher costs associated with both the dedicated hardware and the DSP software implementation required by the single stage digital filter solution.

Thus, there is a need in the art for a single stage filter and method of operation that produces a filtering function having a symmetrical response about the unity gain line without the overhead and cost of additional hardware circuitry and software algorithms.

DETAILED DESCRIPTION OF THE DRAWINGS

The present invention discloses a data processing system for filtering data and an associated method of operation that implements a single stage filter having a symmetrical response about the unity gain line. The data processing system preferably includes a processor, a memory, a bus, and an input/output port. The input/output port receives filter control parameters from a user, receives digitized input data, and transmits filtered digitized data. The memory operably couples to the bus and stores the filter control parameters, instructions for operations, and digitized data. The processor couples to the bus, receives the filter control parameters and instructions from memory and calculates filter coefficients based upon the filter control parameters. The processor then implements a single stage digital filter based upon the filter coefficients, and filters the digitized input data to produce the filtered digitized data using the filter coefficients. When the filter control parameters are altered by the user, new filter coefficients are determined so that the single stage filter implemented by the processor is symmetrical about the unity gain line.

Figure 3:
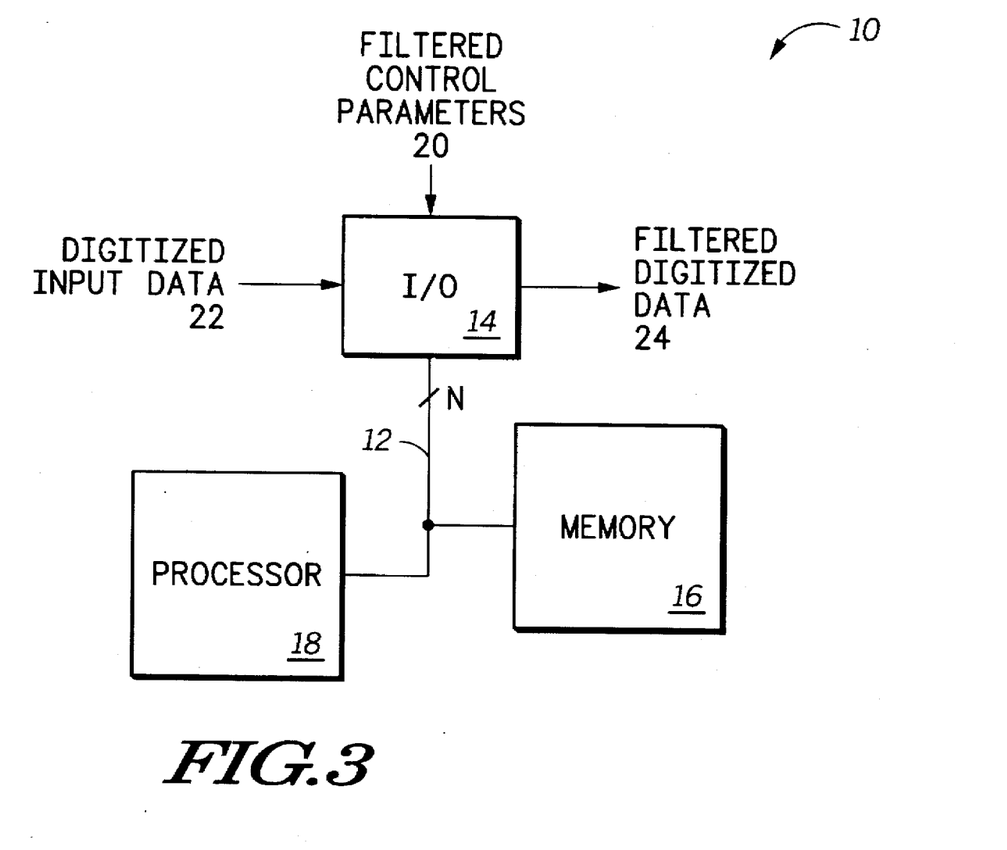
FIG. 3 is a block diagram illustrating a data processing system in accordance with the present invention.

FIG. 3 illustrates a data processing system 10 comprising a bus 12, an input/output port (I/O) 14, a memory 16, and a processor 18. The bus preferably has a width of N wherein N is sufficient to communicate data and instructions among the input/output port 14, the memory 16, and the processor 18. In this embodiment of the invention, bus 12 includes a data portion, an address portion, and a control portion for providing the processor 18 with sufficient control over both the I/O port 14 and memory 16 to execute functions to be performed by data processing system 10.

I/O port 14 is coupled to bus 12 to receive both filter control parameters 20 and digitized input data 22 and to transmit filtered digitized data 24. I/O port 14 preferably comprises either a parallel or serial interface that may be used in conjunction with the bus 12 and external connections. Additionally, it should be recognized that I/O port 14 may be configured in any number of manners such that it may import or receive digitized input data 22 and also output filtered digitized data 24. Further, I/O port 14 may be configured so that filter control parameters 20 are read and input when the system initiates operation or when the filter control parameters have been altered. Thus, I/O port 14 may be interrupt driven so that it requires an interface with processor 18 only when data is to be provided for a first time or is modified during operation. Further, I/O port 14 may be controlled by the bus to provide the filtered digitized data 24 upon receipt of a request either by processor 18 or by another device connected to receive the filtered digitized data 24. Thus, the I/O port includes data buffering capabilities and control circuitry.

Memory 16 is coupled to bus 12 and to store filter control parameters 20, instructions for performing the operations of the present invention, and digitized data that may comprise either digitized input data 22 or filtered digitized data 24. Memory 16 may include dynamic memory and static memory for implementing the present invention. It should be noted that if data processing system 10 comprises a digital signal processing system, memory 16 will also include read only memory (ROM) that stores instructions dedicated to performing the functions required by the present invention. However, since data processing system 10 is likely to perform additional functions which are not specifically required by the present invention, memory 16 also includes a dynamic portion of memory such as random access memory (RAM) that may be written as required.

Processor 18 is coupled to bus 12, receives the filter control parameters 20 and digitized input data 22 via bus 12 and from I/O port 14 and instructions via bus 12 from memory 16. Processor 18 calculates filter coefficients based upon the filter control parameters 20. After calculation of the filter coefficients, processor 18 implements a single stage digital filter based upon the filter coefficients 20 and performs the digital filter to filter the digitized input data 22 to produce the filtered digitized data 24.

The single stage filter function of the digital filter implemented by the processor 18 is symmetrical about the unity gain line. In order to produce a single filter function that is symmetrical about the unity gain line, processor 18 must perform operations to generate filter coefficients for each new set of filter control parameters 20. Processor 18 may only produce filter coefficients that may be used to implement a single stage filter function that is symmetrical about the unity gain line when the filter coefficients are adjusted or recalculated based upon the filter control parameters 20.

Thus, data processing system 10 of the present invention provides the important benefits of implementing a single stage filter having a filtering function that is symmetrical about the unity gain line. Prior art single stage filters without coefficient tables coupled to the gain or boost setting yielded a non-symmetrical filtering function about the unity gain line. Other prior art devices required two single stage filters to produce a response equivalent to the filter response of the filter of the present invention. The filtering function implemented by the data processing 10 of the present invention provides the same benefits as the prior art filters with a fraction of the processing and circuit overhead requirements. Thus, data processing system 10 of the present invention implements a filter having superior performance at a lower cost than the prior art systems.

Figure 4:
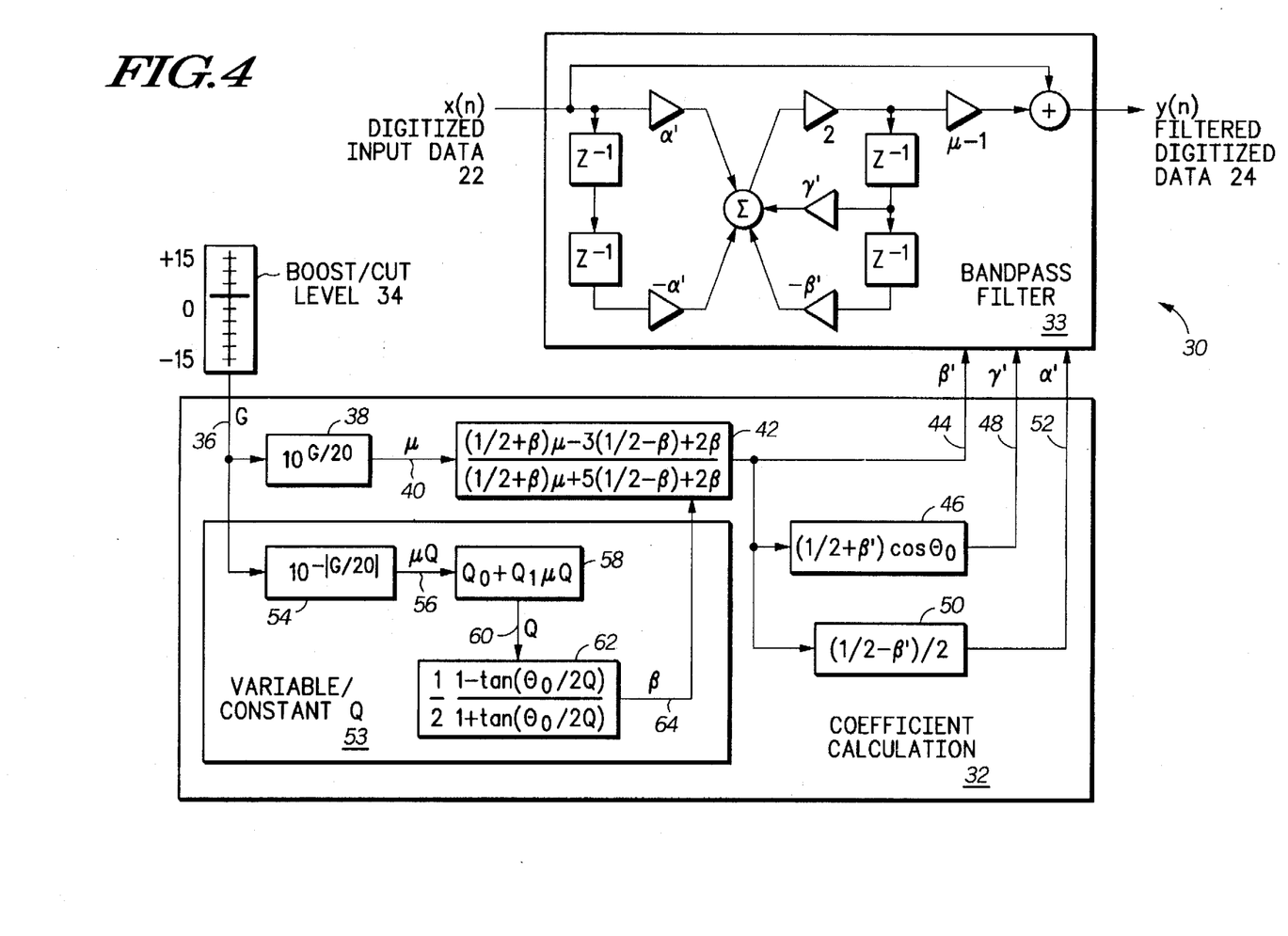
FIG. 4 is a block diagram illustrating a single stage band pass filter having a variable Q factor in accordance with the present invention.

FIG. 4 illustrates a band pass filtering system 30 implemented in accordance with one embodiment of data processing system 10 of the present invention of FIG. 3. In this embodiment of the invention, band pass filtering system 30 implements a single stage bandpass filter 33 at a center frequency within a graphic equalizer or some other device having a plurality of band pass segments across a frequency spectrum. Thus, the band pass filtering system 30 of FIG. 4 represents only a portion of a larger filtering system. In accordance with the teachings of the present invention, the band pass filtering system 30 could be implemented on each of a plurality of bands of interest to alter subject signals in accordance with user input (boost/cut level) 34.

Preferably, the band pass filtering system 30 receives the user input 34 (boost/cut level), calculates filter coefficients based upon the boost/cut level 34, and uses the filter coefficients in conjunction with the band pass filter 33 to perform a filtering function. Using the coefficients, the band pass filter 33 filters digitized input data 22 to produce filtered digitized data 24. The filtered digitized data 24 is then output and subsequently used by an external device (not illustrated herein).

Coefficient calculation block 32 of FIG. 4 illustrates a method for calculating filter coefficients based upon the gain (G) 36. In a first step of coefficient calculation 32, the boost/cut level 34 is provided to block 38. Block 38 converts the boost/cut level(G) 36 to a linear value mu ($\mu$) 40. The linear value of mu ($\mu$) 40 is provided to block 42 which also receives beta ($\beta$) 64 from a Q factor block 53 to produce the new coefficient beta prime ($\beta'$) 44. Beta prime ($\beta'$) 44 is also provided to block 46 to produce coefficient gamma prime ($\gamma'$) 48 and provided to block 50 to produce coefficient alpha prime ($\alpha'$) 52. Coefficients beta prime ($\beta'$) 44, gamma prime ($\gamma'$) 48, and alpha prime ($\alpha'$) 52 are provided to band pass filter 33 to be implemented as a single stage band pass filter. In accordance with the coefficient calculation block 32, the coefficients generated enable the filtering function of the single stage band pass filter 33 to be symmetrical about the unity gain line even though the filter 33 has only a single stage.

The Q factor of a filter is known in the art to be a measure of a 3 dB width of a band pass filter. As the Q factor increases for a particular band pass filter, the filter response for the filter narrows. In many applications, it is desirable to determine the width of the band pass filter for a particular application. Thus, the present invention provides for the setting of the Q factor of the filter by either the user of the filter or the programmer of the filter.

In a preferred form of the present invention, the Q 60 factor of the digital filter is a function of the boost/cut level 34 of the band pass filter at the center frequency. In accordance with the preferred form of the present invention, the Q 60 factor of the digital filter decreases as the magnitude of the boost/cut level increases. Preferably, the Q 60 factor equals a constant $Q_0$ factor plus a $Q_1$ factor times a function of the boost/cut value. Referring to the variable/constant Q block 53 of FIG. 4, in order to produce the coefficient beta ($\beta$) 64, the boost/cut level(G) 36 is provided to block 54 to produce $\mu Q$ 56. In this embodiment of the invention, $\mu Q$ decreases as the magnitude of the boost/cut level 36 increases based upon a function of block 54. Signal $\mu Q$ 56 is provided to block 58 where $\mu Q$ is multiplied by $Q_1$ and added to $Q_0$ to produce the Q 60 of the filter. The Q 60 is then provided to block 62 to generate beta ($\beta$) 64. $\theta_0$ is a normalized center frequency of the band pass filter 33 wherein $\theta_0$ is equal to $2\pi$ times the center frequency of the band pass filter 33 divided by a sampling frequency. The mathematical calculations required by block 32 to calculate filter coefficients are performed by an ALU (arithmetic logic unit) in processor 18. Once produced in block 53, Beta ($\beta$) 64 is then provided to block 42 where it is used along with mu ($\mu$) 40 to calculate beta prime ($\beta'$) 44. Use of an ALU to perform addition, subtraction, multiplication, and division functions is well known in the data processing art and will not be described in greater detail therein.

In the present embodiment of the invention, each of the three constants, beta prime ($\beta'$) 44, gamma prime ($\gamma'$) 48, and alpha prime ($\alpha'$) 52 has been calculated in block 32 in order to guarantee a symmetrical filter response about the unity gain line and to provide a desired Q factor of the filter. The filtering function provided by the band pass filter 33 using the filter coefficients will have the desired boost/cut level, the desired symmetrical response about the unity gain line, and the desired Q factor.

The band pass filter 33 is a standard single stage infinite impulse response filter as is known in the data processing art. The band pass filter coefficients, beta prime ($\beta'$) 44, gamma prime ($\gamma'$) 48, and alpha prime ($\alpha'$) 52 are applied to the infinite impulse response band pass filter 33 as is shown to produce the band pass filter response at the center frequency. In accordance with the present invention, the band pass filter has a 0 dB, or unity gain, response away from the frequency band of interest and operates on the digitized input data 22 within a frequency band of interest. As was previously described, the Q factor of the filter relates a "fall off" rate of the band pass filter away from the center frequency of the band pass filter.

In accordance with the band pass filter 33 and the coefficient calculation block 32, band pass filtering system 30 illustrated in FIG. 4 provides a symmetrical filtering response about the unity gain line when operating on the digitized input data 22 to produce the filtered digitized data 24. Therefore, the band pass filtering system 30 provides the important benefits of producing a symmetrical filtering function having a variable Q factor in a minimized number of mathematical operations. Primarily, the reduction in processing and overhead requirements occurs because only a single stage band pass filter 33 is required to produce the symmetrical response as opposed to the dual stage band pass filter required by prior art devices.

The additional overhead of calculating coefficients in block 32 of FIG. 4 occurs only when the filtering operation is initiated or when any of their user settings 34 have been modified. When the user settings 34 remain constant, the band pass filter 33 illustrated in FIG. 4 uses the same band pass filter coefficients beta prime ($\beta'$) 44, gamma prime ($\gamma'$) 48, and alpha prime ($\alpha'$) 52 for all operations. Thus, except for the slight overhead associated with calculating the coefficients in block 32, the band pass filter 33 of FIG. 4 performs the same filtering operation in approximately one-half of the number of digital operations as is required by the prior art devices using dual stage filtering. Therefore, the present invention reduces processing requirements, power consumption, and cost.

The functions described in FIG. 4 may be performed with an arithmetic logic unit (not illustrated herein) in association with data processing system 10 of FIG. 3. In a typical application, the band pass filter 33 and coefficient calculation block 32 illustrated in FIG. 4 will be performed for a plurality of center frequency values, with each center frequency value having a desired boost/cut value 34. In this fashion, the digitized input data 22 will be effectively fed through each of the band pass filters wherein each band pass filter operates on a particular frequency band of interest. Upon completion of the filtering process, the data processing system 10 will produce filtered digitized data 24 that has been filtered for each frequency band of interest. In this fashion, a complete filtering function may be performed.

Figure 5:
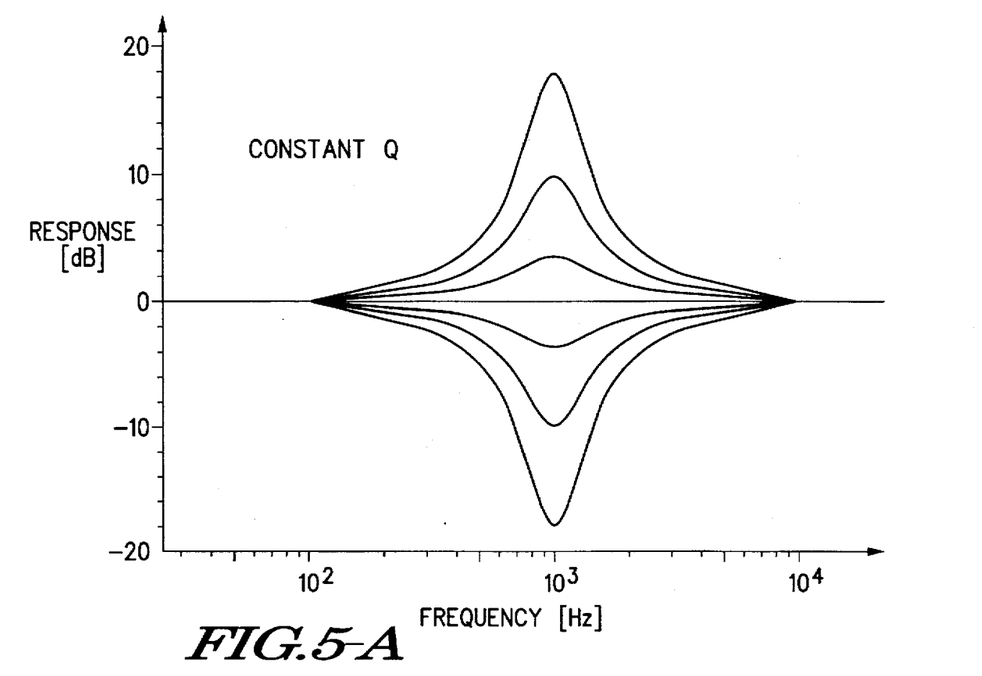
FIG. 5A is a graph illustrating a filter response of the filter of FIG. 4 having a constant Q factor in accordance with the present invention.
FIG. 5B is a graph illustrating a filter response of the filter of FIG. 4 but having a variable Q factor in accordance with the present invention.

FIG. 5A illustrates a frequency response of a band pass filter having a constant Q factor. As is illustrated in FIG. 5A, the apparent width of the filter changes depending upon the response (dB) of the filter. As is well known in the data processing art, this characteristic is associated with a constant Q factor. The data processing system 10 of FIG. 3 has a mode of operation employing a single stage band pass filter which produces the frequency response of FIG. 5A.

FIG. 5B illustrates a frequency response of a band pass filter having a variable Q factor in accordance with the coefficient calculation in block 32 of FIG. 4. In this case, the Q calculation in block 53 includes a $Q_0$ value of zero and a $Q_1$ value of five. Based upon the input parameters $Q_0$ and $Q_1$, the filtering function of FIG. 5B has a variable Q depending upon the response, in decibels, at a center frequency. As shown, the filtering function appears wider at the higher response levels than at the lower response levels. In many audio applications, the response illustrated in FIG. 5B is sonically preferable to the response illustrated in FIG. 5A. Thus, for particular applications, the data processing system 10 of the present invention may be altered to produced a filtering function having a variable Q factor. In this fashion, the filtering function is more flexible and produces better results as compared to a constant Q filter function. However, it should be noted that the teachings of the present invention allow for use of a constant Q by setting $Q_1$ to zero and $Q_0$ to Q in block 58 of FIG. 4.

Figure 6:
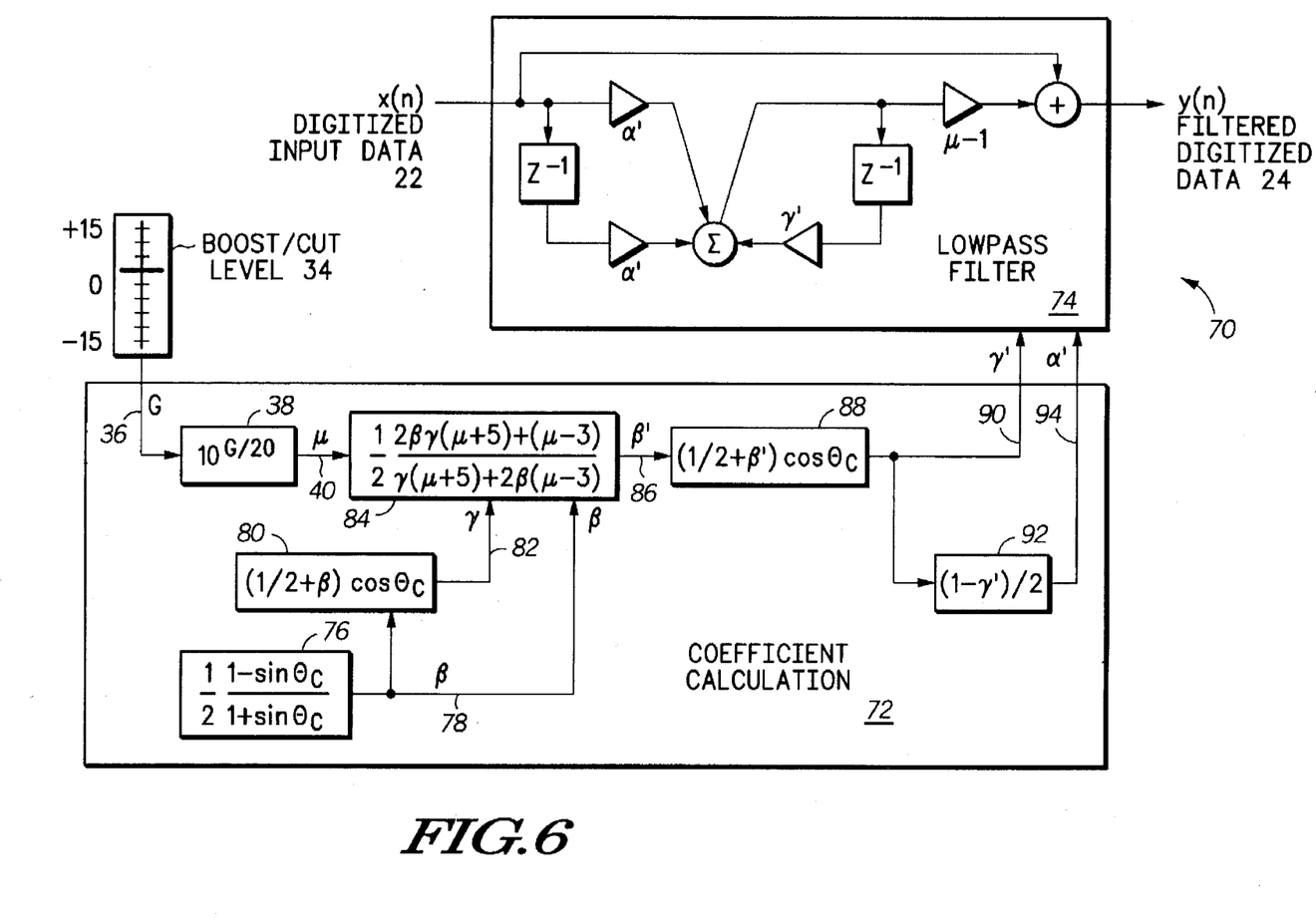
FIG. 6 is a block diagram illustrating a single stage low pass filter in accordance with the present invention.

FIG. 6 illustrates a low pass shelving filter 70 in accordance with the present invention. The low pass shelving filter 70 may be used in conjunction with data processing system 10 of FIG. 3 to low pass filter the digitized input data 22 and produce the filtered digitized data 24. A boost/cut level 34 for the low pass shelving filter is provided by a user to produce the gain(G) 36 of the shelving filter 70. Gain (G) 36 is then provided to block 38 wherein the gain is linearized to produce mu (μ) 40. Mu (μ) 40, gamma (γ) 82, and beta (β) 78 are provided to block 84. Beta (β) 78 is generated by block 76 based upon the cut frequency $θ_c$ which is equal to 2π times the 3 dB frequency of the filter divided by the sampling frequency. Beta (β) 78 is then provided to block 80 to generate gamma (γ) 82. Thus,mu (μ) 40, gamma (γ) 82, and beta (β) 78 are provided to block 84 of the coefficient calculation section 72 of the low pass shelving filter 70 to generate beta prime (β') 86. Beta prime (β') 86 is then applied to block 88 to generate gamma prime (γ') 90. Gamma prime (γ') 90 is then provided to low pass filter 74. Gamma prime (γ') 90 is also provided to block 92 to generate alpha prime (α') 94. Low pass filter 74 comprises a single stage first order infinite impulse response filter that implements the low pass shelving filter function. In accordance with the low pass shelving filter 70 of FIG. 6, a filtering function of the low pass shelving filter 70 is symmetrical about the 0 dB or unity gain line.

Figure 7:
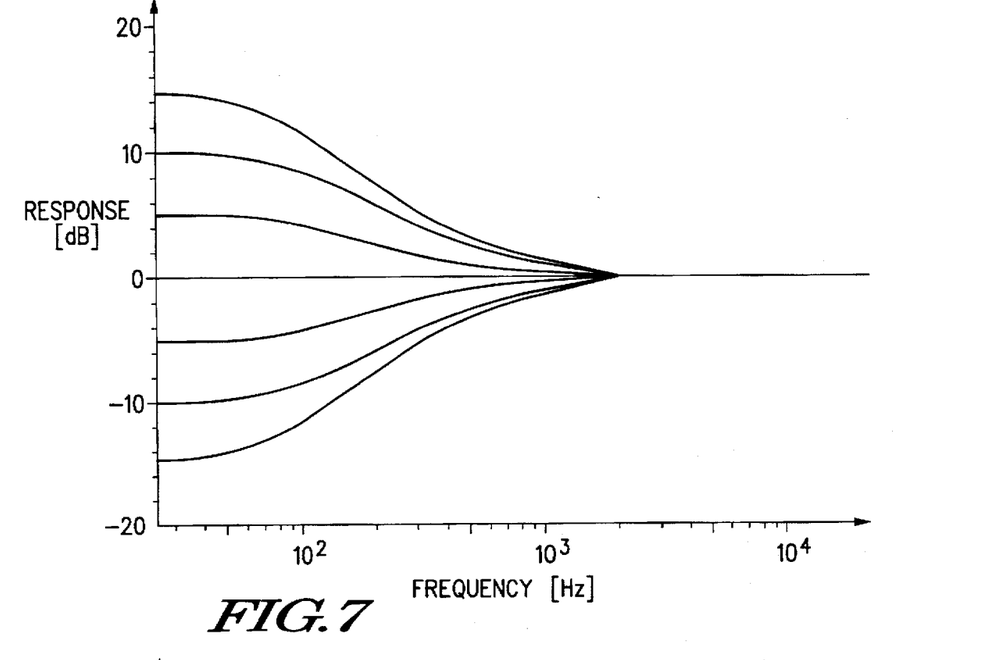
FIG. 7 is a graph illustrating a filter response of the single low pass filter of FIG. 6 in accordance of the present invention.

FIG. 7 illustrates a graph showing a frequency response of the low pass shelving filter of FIG. 6. As is illustrated in FIG. 7, the frequency response of the low pass shelving filter 70 is symmetrical about the 0 dB or unity gain line. Thus, the low pass shelving filter 70 illustrated in FIG. 6 whose filtering function is illustrated in FIG. 7 produces the important advantages of providing the symmetrical response about the 0 db line. Because the symmetrical response is produced using a single stage infinite impulse response filter 74, the filtering function may be implemented at a lower data processing rate than required by prior art devices. The lower processing rate reduces the cost to implement the filter as well as the power consumption of the filter 70 during its operation. Further, because the coefficients are produced by coefficient calculation block 72, dynamically as the boost/cut level 34 received from the user changes, low pass shelving filter 70 is able to to produce a symmetrical result at any selected boost/cut level 34. Unlike prior art devices which may use a look-up table to establish a symmetrical response, the apparatus and method of the present invention utilize section 72 of FIG. 6 to uniquely identify the coefficients required to perform the symmetrical filtering function for any desired boost/cut level.

Figure 8:
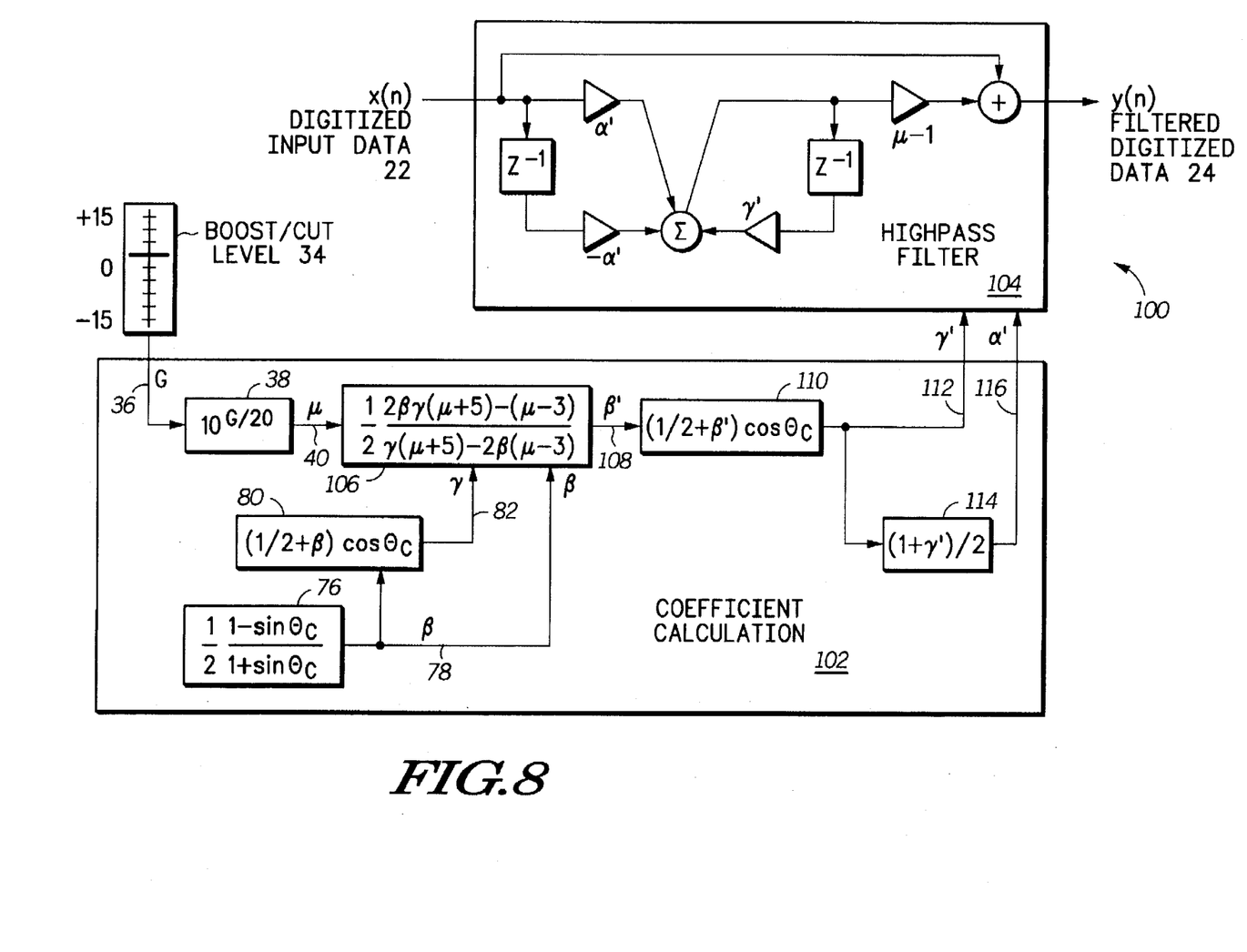
FIG. 8 is a block diagram of a single stage high pass filter in accordance with the present invention.

FIG. 8 illustrates a high pass shelving filter 100 that may be used in conjunction with the data processing system 10 of FIG. 3. The high pass shelving filter 100 includes both a coefficient calculation block 102 and a high pass filtering block 104. The coefficient calculation block 102 determines the filter coefficients gamma prime (γ') 112 and alpha prime (α') 116 based upon a boost/cut level 34 received from a user. The boost/cut level 34 is used to generate the gain 36 on the dB scale. Passing the gain 36 from the dB scale through block 38 yields a linear gain denoted as mu (μ) 40. Beta (β) 78 of the coefficient calculation block 102 is determined by block 76 using the cutoff frequency $0_c$ of the high pass shelving filter 100. Beta (β) 78 is equal to 2π times the 3 dB frequency of the filter divided by the sampling frequency. Beta (β) 78 is then provided to block 80 to produce gamma (γ) 82 and is also provided directly to block 106. Mu (μ) 40, gamma (γ) 82, and beta (β) 78 are provided to block 106 to generate beta prime (β') 108. Beta prime (β') 108 is provided to block 110 to generate gamma prime (γ') 112. Beta prime (β') 108 is also provided to block 114 to generate alpha prime (α) 116.

Thus, coefficient calculation block 102 of the high pass shelving filter 100 generates gamma prime (γ') 112 and alpha prime (α') 116 and provides both γ' and α' to high pass filter 104. High pass filter 104 uses the coefficients gamma prime (γ') 112 and alpha prime (α') 116 to produce a filtering function that is symmetrical about the 0 dB or unity gain line. The filtering function implemented by high pass filter 104 is used to filter the digitized input data 22 and to generate the filtered digitized data 24 to either boost or cut higher frequency components from the digitized input data 22. Depending upon the boost/cut level 34 provided by the user, such boosts or cuts will be performed on the higher frequency components in the spectrum.

Figure 9:
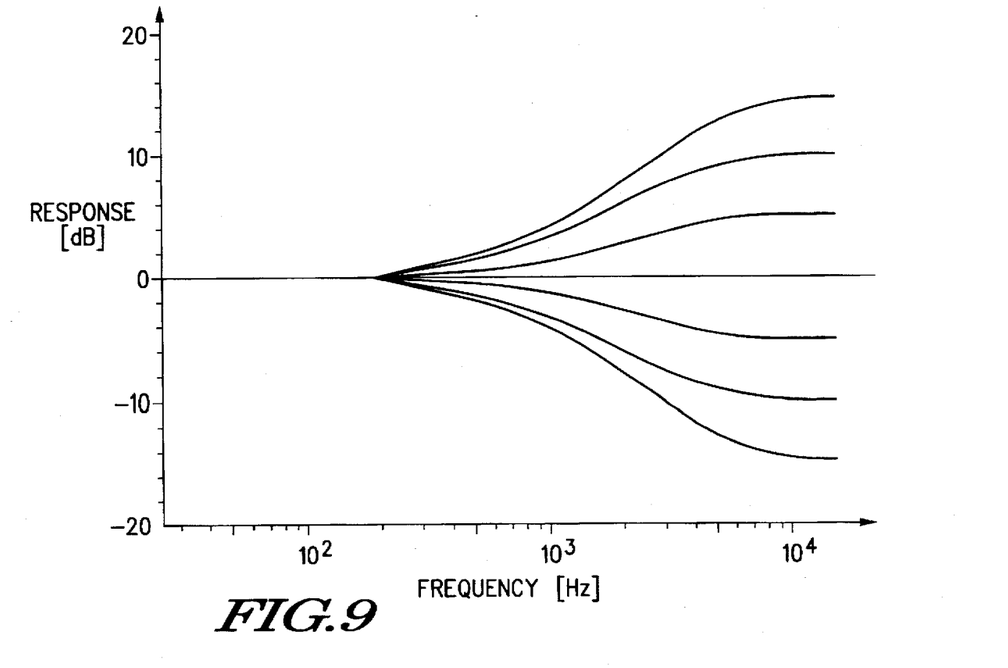
FIG. 9 is a graph illustrating a filter response of the single high pass filter of FIG. 8 in accordance with the present invention.

FIG. 9 is a graph illustrating the symmetrical response about the unity gain line of the high pass shelving filter 100 illustrated in FIG. 8. As is illustrated in FIG. 9, the high pass shelving filter 100 has a filtering function which is symmetrical about the unity gain line. Thus, the high pass shelving filter 100 of FIG. 8 produces the symmetrical response in a reduced computational time as has been previously discussed. In this fashion, a symmetrical high pass filter may be implemented which operates with reduced processing requirements and, thus, reduces costs associated with the filter as well as the power consumption of the filter during its operation. Because the coefficients are calculated in block 102 of FIG. 8 in response to the user input level, the coefficients are updated at each change of the user input boost/cut level 34. Such dynamic operation guarantees the symmetrical nature of the high pass shelving filter 100, while reducing the processing requirements in calculating the coefficients provided to high pass filter 104.

Figure 10:
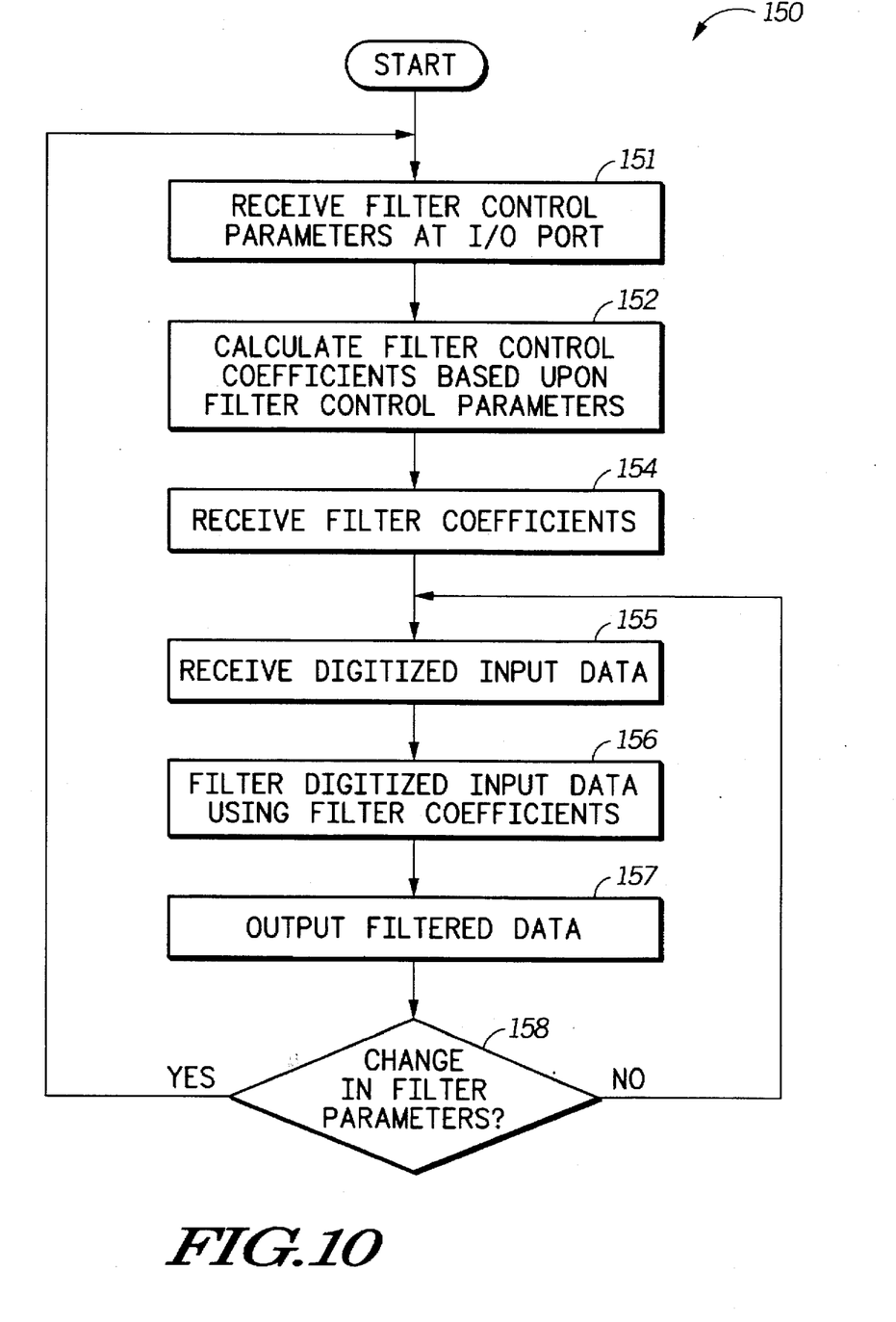
FIG. 10 is a flow chart diagram illustrating a graphic equalizer in accordance with the present invention.

FIG. 10 illustrates a method 150 of filtering digital data in accordance with the present invention. Method 150 includes as a first step at 151 for receiving filter control parameters at an input/output port. As has been previously discussed, these filter control parameters may be received on a real-time basis from a user or in another fashion from a programmer. In a preferred mode of the invention, the filter control parameters describe a boost/cut value associated with a particular filtering function to be performed. One preferred form of the invention performs a band pass filtering function at a desired center frequency. Another form of the present invention performs a plurality of band pass filtering functions across a frequency spectrum of interest. This is the case of the graphic equalizer. A further form of the present invention performs a high pass filtering function while a final form performs a low pass filtering function. Based upon the desired filtering functions, filter control parameters are received at the input/output port.

Next, at step 152, the method includes, upon receipt of the filtering control parameters, a step for calculating coefficients based upon the filter control parameters. The filter coefficients produce a frequency response that is symmetrical about the unity gain line when applied to a digital filter. As has been previously discussed, the filter coefficients are calculated only upon an initial receipt of the filter control parameters or receipt of modified filter control parameters, such changes requiring a recalculation of the filter coefficients. The recalculation function of the method of the present invention produces the symmetrical filtering response of the digital filtering function implemented.

Next, at step 154, the method includes a step for receiving the filter coefficients at a digital filter. Preferably, the digital filter of the present invention is a data processing system which was previously described in conjunction with FIG. 3. This data processing system preferably includes an arithmetic logic unit for performing the filtering functions.

Next, at step 155, the method includes a step for receiving digitized input data at a digital filter. The digitized input data may comprise digitized audio data or other data to be operated upon.

At step 156, the method includes a next step for filtering the digitized input data using the digital filter generated by the filter coefficients. The filter coefficients that have been previously produced in step 152 guarantee the symmetrical response of the digital filter about the unity gain line. Thus, step 156 yields such symmetrical response about the unity gain line.

Next, at step 157, the method includes a step for outputting the filtered digitized data. In conjunction with the contemplated use of the present invention, the filtered data may comprise audio data that is output to a digital-to-analog converter prior to its presentation to a user.

Next, at step 158, it is determined whether there has been change in filter parameters since a last filtering step at block 156. If there has been a change in the filtering parameters the method proceeds to block 151 wherein new filtering control coefficients are calculated. However, if at block 158 there has been no change in the filter parameters, the method proceeds to step 155 wherein new digitized input data is received to be filtered.

In accordance with the method 150 of the present invention, three separate filtering functions may be performed. A single stage band pass filter may be performed implementing a second order infinite impulse response filter. A second filtering function that may be performed is a low pass filtering function performing a single stage, first order infinite impulse response filter. Finally, a third filtering function that may be performed by the filter of the present invention is a single stage high pass filtering function performing a first order infinite impulse response filter.

The method 150 of the present invention provides a symmetrical response using only a single stage filter. Unlike the prior art devices which required multiple filters to achieve a symmetrical filtering response or more complicated methods with a single filter, the method of the present invention provides the desired symmetrical response using approximately one-half of the processing requirements. The reduced processing requirements for performing the digital filter lowers both the cost of performance and the power consumption.

In the method 150 illustrated in FIG. 10, the Q factor of the filtering function performed by the method may be altered such that the Q factor is a function of the boost/cut value of the particular filter supplied by the user. In this fashion, a desired filtering response may be generated by externally dialing in the Q factor or modifying the Q factor based upon the overall gain of the particular filter. In this fashion, using the simple single filter, increased performance may be had with no increase in processing requirements.

Figure 11:
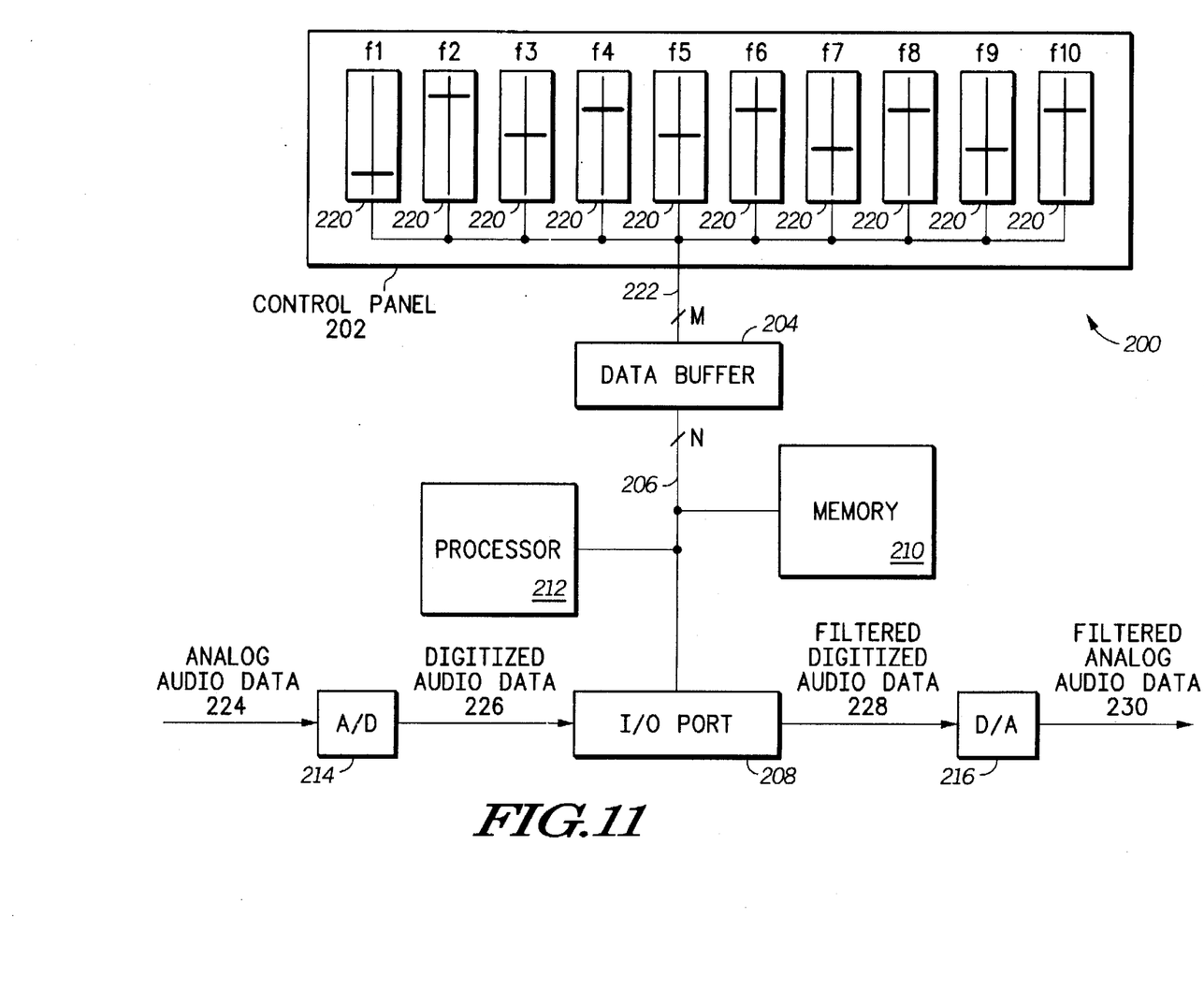
FIG. 11 is a block diagram of a graphic equalizer for selectively filtering audio data.

FIG. 11 illustrates a graphic equalizer 200 for selectively filtering audio data. The graphic equalizer comprises a control panel 202, a data buffer 204; a bus 206, I/O port 208, memory 210, and a processor 212. Note that the graphic equalizer illustrated in FIG. 11 includes only ten bands. However, it should be understood that a number of bands and the frequency ranges associated with the bands is determined by an application. For example, in "sound reinforcement" applications, thirty-one bands placed at one-third octave centers are used. In home stereo applications, ten bands placed at octave centers are used. In automobile sounds systems, five to seven bands placed at one and a half to two octave centers are used.

In the example illustrated in FIG. 11, the control panel 202 receives filter control parameters from the user. Preferably, the control panel 202 includes a plurality of boost/cut selectors 220. Each boost/cut selector corresponds to a center frequency $F_1$ through $F_{10}$ of the plurality of frequencies available for control. In the case of the graphic equalizer 200, each of the center frequencies $F_1$ through $F_{10}$ corresponds to a frequency band of interest across the frequency spectrum of interest which is usually 20 to 20,000 hertz.

Based upon the individual selections made by the user via the control panel 202, the filter control parameters are provided to the data buffer 204 via a data bus 222 having a width of M. Data bus 222 has sufficient capacity to convey all of the data from the control panel to the data buffer 204. Data buffer 204 receives the filter control parameters from control panel 202 and is coupled to 206 to receive the filter control parameters. Bus 206 also passes instructions and digitized data between each of memory 210, processor 212 and I/O port 208.

I/O port 208 receives digitized audio data 226 and transmits filtered digitized audio data 228. Memory 210 is coupled to bus 206 and stores filter control parameters, instructions and digitized audio data. Processor 212 is coupled to bus 206 and receives filter control parameters and instructions from memory 210. Processor 212 calculates filter coefficients based upon the filter control parameters and implements a digital filter based upon the filter coefficients. The digital filter implemented by the processor 212 filters the digitized audio data 226 and produces the filtered digitized 228 such that a filtering function of the digital filter is symmetrical about the unity gain line. As those of ordinary skill in the art will appreciate data is passed back and forth between processor 212 and I/O port 208 to perform the necessary filtering operations of graphic equalizer 200 illustrated in FIG. 11.

The graphic equalizer may also includes an analog to digital converter 214 that may be used to convert analog audio data 224 to digitized audio data 226. Graphic equalizer 200 may also include a digital to analog (D/A) converter 216 which converts the filtered digitized audio data 228 to filtered analog audio data 230. As those skilled in the art will readily appreciate, the graphic equalizer 200 of FIG. 11 could be used in an analog system with the addition of the analog to digital converter 214 and digital to analog converter 216.

Graphic equalizer 200 of the present invention provides the important benefit of providing a symmetrical response about the unity gain line. In any audio application including high end audio applications, a symmetrical response of the graphic equalizer about the unity gain line reduces distortion that would otherwise be heard in the audible information played to the user. Thus, the present invention provides symmetry in a low cost, highly efficient manner that has previously been unobtainable. Thus, graphic equalizer 200 of the present invention performs sophisticated functions using less processing requirements at a lower cost.

Figure 12:
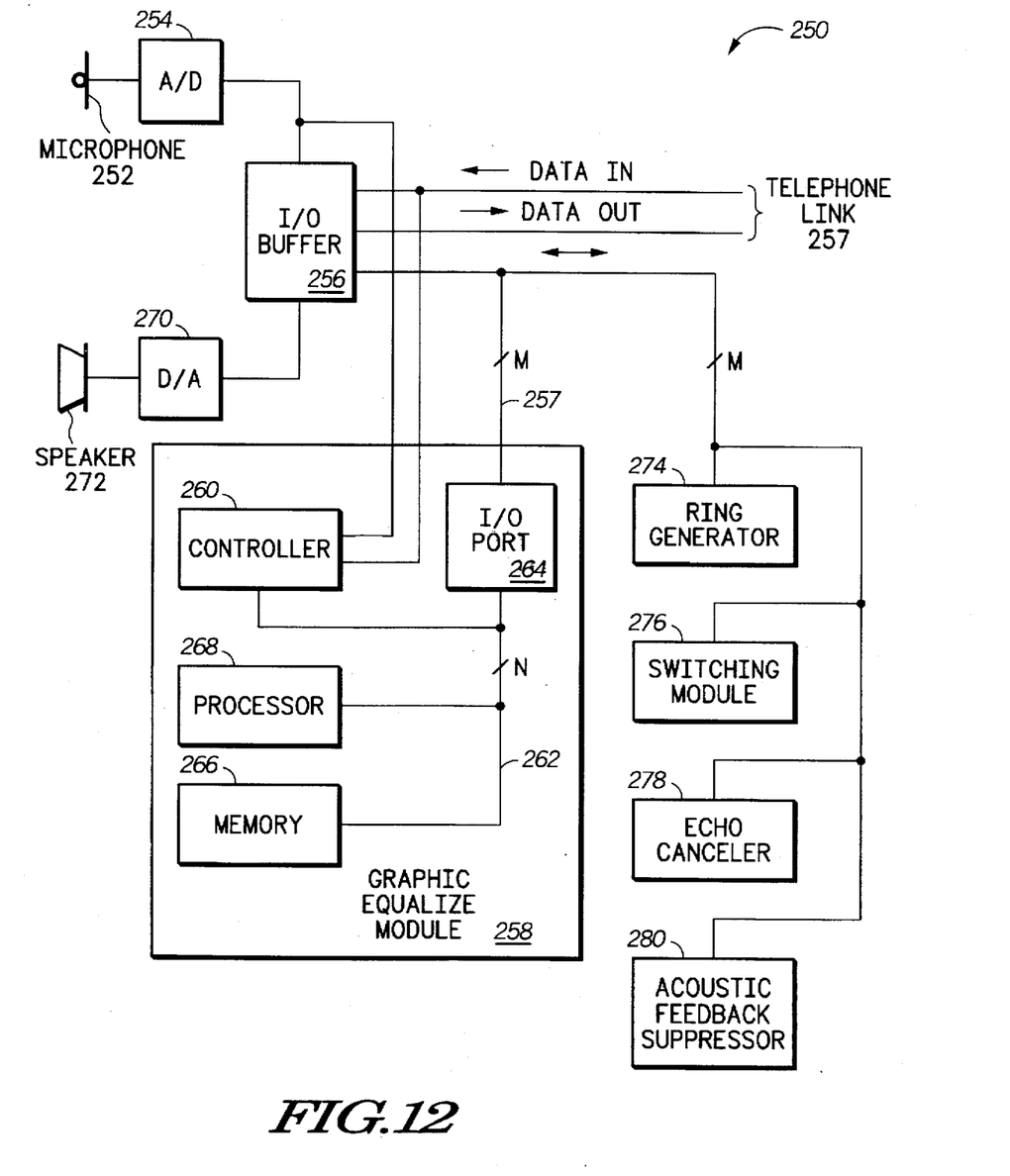
FIG. 12 is a block diagram illustrating a digital speaker telephone in accordance with the present invention.

FIG. 12 illustrates a digital speaker telephone 250 in accordance with a second embodiment of the present invention. Digital speaker telephone 250 comprises a microphone 252, an analog to digital (A/D) 254, an I/O buffer 256, graphic equalizer module 258, a digital to analog (D/A) converter 270, and speaker 272.

Microphone 252 receives acoustic audio data from a user and produces analog audio data to the analog to digital (A/D) converter 254. A/D converter 254 receives the analog audio data from the microphone 252 and converts the analog audio data to produce digitized audio data. I/O buffer 256 receives the digitized audio data from A/D converter 254 and buffers the data for receipt by modules within the speaker telephone. Additionally, I/O buffer 256 transmits the data on to a telephone link 257. Telephone link 257 couples the digital speaker telephone 250 to a remote location for communication between the locations.

The graphic equalizer module is coupled to I/O buffer 256 and comprises a controller 260, a bus 262, I/O port 264, memory 266, and the processor 268. The controller monitors the digitized audio data and produces filter control parameters based upon the digitized audio data. The bus 262 is coupled to the controller 260 and passes filter control parameters, instructions, and digitized data. I/O port 264 is coupled to the bus 262 and receives filtering control parameters and digitized audio data. I/O port 264 transmits digitized audio data to I/O buffer 256 over bus 257 having a width of M. The width M is sufficient to satisfy the data transmission requirements required.

Memory 266 is coupled to bus 262 and stores the filtering control parameters, instructions and digitized audio data. Processor 268 is coupled to bus 262 and receives filtering control parameters instructions from memory 266. Processor 268 calculates filter coefficients based upon the filter control parameters and implements a digital filter based upon the filter coefficients. Resultantly, the digital filter filters the digitized input data to produce the filtered digitized data. The filtered digitized data is transmitted through the I/O port 264 across bus 257 to I/O buffer 256. This filtered digitized data may be transmitted to D/A converter 270 which converts the filtered digitized audio data to filtered analog data. The D/A converter 270 then passes the filtered digitized audio data to the speaker 272 which receives the filtered analog data and produces filtered acoustic audio data. The filtered data may also be transmitted across telephone link 257 through I/O buffer 256. In this fashion, the frequency response of the digitized data may be shaped to compensate for poor response in other parts of the system.

Thus, the digital speaker telephone 250 of the present invention provides the important advantage of graphically equalizing the digitized audio data prior to its reproduction to the user of the digital speaker telephone 250 or its transmission across telephone link 257. The manner in which the digital data is filtered is symmetrical about the unity gain line, but with reduced processing requirements as compared to the prior art devices.

Speaker telephone 250 may also include a ring generator 274 for producing an audible ring upon receipt of a ring generation signal. Speaker telephone 250 may also include a switching module 276 operably coupled to the I/O buffer 256 wherein the switching module 276 performs switching operations. The digital speaker telephone 150 may also include an echo canceler 278 which is coupled to I/O buffer 256. The echo canceling module 278 removes echoes from the digitized audio data. The echo canceling module 278 may also be programmed to remove both local echoes and remote echoes produced across telephone link 257. Finally, digital speaker telephone 250 may include an acoustic feedback suppression module 280 which is coupled to I/O port 256. The acoustic feedback suppression module 280 receives digitized audio data and removes feedback signals from the digitized audio data that is caused by the acoustic coupling between speaker 272 and microphone 252. In this fashion, positive feedback from the digitized audio signal received via the microphone 252 is removed.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A data processing system comprising:

a bus, wherein the bus passes data and instructions;

an input/output port operably coupled to the bus, wherein the input/output port receives filter control parameters and digitized input data, and wherein the input/output port transmits filtered digitized data;

a memory operably coupled to the bus, wherein the memory stores the filter control parameters, instructions, and digitized input data; and a processor operably coupled to the bus, wherein the processor receives the filter control parameters and instructions from the memory, wherein the processor calculates filter coefficients based upon the filter control parameters, wherein the processor implements a digital filter based upon the filter coefficients to filter the digitized input data and to thereby produce the filtered digitized data, the digital filter having only a single filter stage, and wherein the digital filter produces a frequency response which is symmetric about a unity gain line.

2. The data processing system of claim 1, wherein the digital filter comprises a single band pass filter.

3. The data processing system of claim 2, wherein the single band pass filter comprise a second order infinite impulse response (IIR) filter.

4. The data processing system of claim 2, wherein the filter control parameters comprise:

at least one center frequency value; and for each center frequency value, a desired filter boost/cut value.

5. The data processing system of claim 4, wherein the processor implements the digital filter by producing a first set of filter coefficients based upon a first center frequency and a first desired filter boost/cut value corresponding to the first center frequency, wherein the first set of filter coefficients produce a filtering function having the first desired filter boost/cut value at the first center frequency.

6. The data processing system of claim 5, wherein the processor implements the digital filter by producing a second set of filter coefficients based upon a second center frequency and a second desired filter boost/cut value corresponding to the second center frequency, wherein the second set of filter coefficients produces a filtering function having the second desired filter boost/cut value at the second center frequency.

7. The data processing system of claim 4, wherein the processor implements the digital filter by determining filter coefficients such that a Q factor of the digital filter using the filter coefficients is a function of the desired filter boost/cut value for the at least one center frequency.

8. The data processing system of claim 7, wherein the processor implements the digital filter by determining filter coefficients such that a Q factor of the digital filter using the filter coefficients conforms to:

$Q_{FILTER} = Q_0 + Q_1 *$ function(boost/cut value)

wherein, $Q_{FILTER}$ is the Q factor of the digital filter, $Q_0$ is a constant, and $Q_1$ is a constant.

9. The data processing system of claim 1, wherein the digital filter comprises a single low pass filter.

10. The data processing system of claim 9, wherein the single low pass filter comprises a first order infinite impulse response (IIR) filter.

11. The data processing system of claim 1, wherein the digital filter comprises a single high pass filter.

12. The data processing system of claim 11, wherein the single high pass filter comprises a first order infinite impulse response (IIR) filter.

13. The data processing system of claim 1, wherein the digital filter comprises an arithmetic logic unit operably coupled to the bus, wherein the arithmetic logic unit receives the filter coefficients and the digitized input data, and wherein the arithmetic logic unit digitally filters the digitized input data based upon the filter coefficients to produce the filtered digitized data in accordance with a digital filtering algorithm.

14. A method of filtering digital data comprising the steps of:
(a) receiving filter control parameters at an input/output port;
(b) upon receipt of the filter control parameters, calculating filter coefficients based upon the filter control parameters, wherein the filter coefficients, when applied to a single stage digital filter, produce a digital filtering function having a frequency response that is symmetric about a unity gain line;
(c) receiving the filter coefficients and digitized input data at the single stage digital filter;
(d) filtering the digitized input data using the single stage digital filter based upon the filter coefficients to produce filtered digitized data; and
(e) outputting the filtered digitized data.

15. The method of claim 14, wherein step (d) includes filtering the digitized input data with a single band pass filter.

16. The method of claim 15, wherein step (d) includes filtering the digitized input data with the single band pass filter, wherein the single band pass filter comprises a second order infinite impulse response (IIR) filter.

17. The method of claim 15, wherein step (a) includes receiving filter control parameters comprising:
at least one center frequency value; and
for each center frequency value, a desired filter boost/cut value.

18. The method of claim 17, wherein seep (b) further includes determining the filter coefficients such that a Q factor of a filtering function using the filter coefficients is a function of the desired boost/cut value.

19. The method of claim 18, wherein step (b) further includes determining the filter coefficients such that a Q factor of the filtering function using the filter coefficients conforms to:

$Q_{FILTER} = Q_0 + Q_1 *$ function(boost/cut value)

wherein, $Q_{FILTER}$ is the Q factor of the digital filter, $Q_0$ is a constant, and $Q_1$ is a constant.

20. The method of claim 15, wherein:
step (a) further includes receiving a first desired filter boost/cut value indicating a boost in gain of the digital filter; and step (b) further includes producing boost filter coefficients based upon a center frequency and the desired filter boost/cut value, wherein the boost filter coefficients produce a filtering function having the first desired filter boost/cut value at the center frequency.

21. The method of claim 20, wherein:
step (a) further includes receiving a desired filter boost/cut value indicating a cut in gain of the digital filter; and step (b) further includes producing boost filter coefficients based upon a center frequency and the desired filter boost/cut value, wherein the boost filter coefficients produce a filtering function having the desired filter boost/cut value at the center frequency.

22. The method of claim 14, wherein step (d) includes filtering the digitized input data with a single low pass filter.

23. The method of claim 22, wherein step (d) includes filtering the digitized input data with the single low pass filter, wherein the single low pass filter comprises a first order infinite impulse response (IIR) filter.

24. The method of claim 14, wherein step (d) includes filtering the digitized input data with a single high pass filter.

25. The method of claim 24, wherein step (d) includes filtering the digitized input data with the single high pass filter comprising a first order infinite impulse response (IIR) filter.

26. The method of claim 14, wherein step (d) includes filtering the digitized input data using an arithmetic logic unit, wherein the arithmetic logic unit receives the filter coefficients and the digitized input data, and wherein the arithmetic logic unit digitally filters the digitized input data based upon the filter coefficients to produce the filtered digitized data in accordance with a digital filtering algorithm.

27. A graphic equalizer for selectively filtering audio data, the graphic equalizer comprising:
a control panel, wherein the control panel receives filter control parameters from a user;
a data buffer operably coupled to the control panel, wherein the data buffer receives the filter control parameters from the control panel;
a bus operably coupled to the data buffer, wherein the bus passes the filter control parameters, instructions, and digitized audio data;
an input/output port operably coupled to the bus, wherein the input/output port receives digitized audio data, and wherein the input/output port transmits filtered digitized audio data;
a memory operably coupled to the bus, wherein the memory stores the filter control parameters, instructions, and digitized audio data; and
a processor operably coupled to the memory, wherein the processor receives the filter control parameters and instructions from the memory, wherein the processor calculates filter coefficients based upon the filter control parameters, wherein the processor implements a single stage digital filter based upon the filter coefficients to filter the digitized audio data and to thereby produce the filtered digitized audio data, and wherein a frequency response of the digital filter is symmetric about a unity gain line.

28. The graphic equalizer of claim 27, further comprising:

an A/D converter operably coupled to the input/output port, wherein the A/D converter receives analog audio data and converts the analog audio data to produce the digitized audio data; and a D/A converter operably coupled to the input/output port, wherein the D/A converter receives the filtered digitized audio data and converts the filtered digitized audio data to produce filtered analog audio data.

29. A digital speaker telephone comprising:

a microphone, wherein the microphone receives acoustic audio data and produces analog audio data;

an A/D converter operably coupled to the microphone, wherein the A/D converter receives the analog audio data and converts the analog audio data to produce digitized audio data;

an input/output buffer operably coupled to the A/D converter and a telephone system connection, wherein the input/output buffer receives digitized audio data and transmits filtered digitized audio data; and a graphic equalizer module operably coupled to the input/output buffer comprising:

a controller, wherein the controller monitors the digitized audio data and produces filter control parameters based upon the digitized audio data;

a bus operably coupled to the controller, wherein the bus passes filter control parameters, instructions, and digitized audio data;

an input/output buffer operably coupled to the bus, wherein the input/output buffer receives filter control parameters and digitized audio data, and wherein the input/output buffer transmits filtered digitized audio data;

a memory operably coupled to the bus, wherein the memory stores the filter control parameters, instructions, and digitized audio data;

a processor operably coupled to the bus, wherein the processor receives the filter control parameters and instructions from the memory, wherein the processor calculates filter coefficients based upon the filter control parameters, wherein the processor implements a single stage digital filter based upon the filter coefficients to filter the digitized audio data and to thereby produce the filtered digitized audio data, and wherein a frequency response of the digital filter is symmetric about a unity gain line;

a D/A converter operably coupled to the input/output buffer, wherein the D/A converter receives the filtered digitized audio data and converts the filtered digitized audio data to produce filtered analog audio data; and a speaker operably coupled to the D/A converter, wherein the speaker receives the filtered analog audio data and produces filtered acoustic audio data.

30. The digital speaker telephone of claim 29, further comprising:

a ring generator operably coupled to the input/output buffer, wherein the ring generator produces an audible ring upon receipt of a ring generation signal.

31. The digital speaker telephone of claim 29, further comprising:

a switching module operably coupled to the input/output buffer, wherein the switching module performs switching operations.

32. The digital Speaker telephone of claim 29, further comprising:

an echo canceling module operably coupled to the input/output buffer, wherein the echo canceling module removes echoes from the digitized audio data.

33. The digital speaker telephone of claim 29, further comprising:

an acoustic feedback suppressor operably coupled to the input/output buffer and the echo canceling module, wherein the acoustic feedback suppressor receives the digitized audio data and removes feedback signals from the digitized audio data.

\* \* \* \* \*